(12) United States Patent
Jiang

(10) Patent No.: US 11,800,657 B2
(45) Date of Patent: Oct. 24, 2023

(54) FLEXIBLE DISPLAY DEVICE

(71) Applicant: Wuhan China Star Optoelectronics Semiconductor Display Technology Co., Ltd., Wuhan (CN)

(72) Inventor: Guobao Jiang, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 16/979,885

(22) PCT Filed: Jul. 20, 2020

(86) PCT No.: PCT/CN2020/103053
§ 371 (c)(1),
(2) Date: Sep. 11, 2020

(87) PCT Pub. No.: WO2022/000598
PCT Pub. Date: Jan. 6, 2022

(65) Prior Publication Data
US 2023/0199980 A1    Jun. 22, 2023

(30) Foreign Application Priority Data

Jul. 2, 2020  (CN) .......................... 202010625457.7

(51) Int. Cl.
*H05K 5/02* (2006.01)
*G06F 1/16* (2006.01)

(52) U.S. Cl.
CPC ......... *H05K 5/0217* (2013.01); *G06F 1/1624* (2013.01); *G06F 1/1652* (2013.01)

(58) Field of Classification Search
CPC .... G06F 1/1652; G06F 1/1637; G06F 1/1624; H05K 5/0217
See application file for complete search history.

(56) References Cited

U.S. PATENT DOCUMENTS

| | | | |
|---|---|---|---|
| 8,711,566 B2* | 4/2014 | O'Brien | G06F 1/1652 361/724 |
| 11,016,532 B2* | 5/2021 | Yang | H04M 1/0268 |
| 11,058,018 B1* | 7/2021 | Yoon | H05K 5/0017 |
| 11,194,363 B2* | 12/2021 | Kim | G06F 1/1626 |
| 11,204,629 B1* | 12/2021 | Kwak | H04M 1/0237 |

(Continued)

FOREIGN PATENT DOCUMENTS

| CN | 107545849 A | 1/2018 |
|---|---|---|
| CN | 107919065 A | 4/2018 |

(Continued)

*Primary Examiner* — Sagar Shrestha
(74) *Attorney, Agent, or Firm* — Nathan & Associates; Menachem Nathan

(57) ABSTRACT

A flexible display device is provided. The display device includes an outer frame, a first supporting plate, a second supporting plate, a roller device, rotating shaft assemblies, and a transmission assembly. When the second supporting plate and the first supporting plate are expanded relatively or merged with each other, the transmission assembly guides the roller device and the rotating shaft assemblies to rotate simultaneously, ensuring smooth transmission of screens in a stretching process or a contracting process, and improving service life of a flexible display screen.

9 Claims, 11 Drawing Sheets

(56) References Cited

U.S. PATENT DOCUMENTS

| | | | |
|---|---|---|---|
| 11,315,447 B2* | 4/2022 | Feng | G06F 1/1652 |
| 2013/0058063 A1* | 3/2013 | O'Brien | G06F 1/1624 |
| | | | 361/807 |
| 2014/0194165 A1* | 7/2014 | Hwang | G06F 3/147 |
| | | | 455/566 |
| 2014/0211399 A1 | 7/2014 | O'Brien | |
| 2017/0064847 A1* | 3/2017 | Lim | G09F 9/30 |
| 2018/0188778 A1* | 7/2018 | Shin | G06F 1/1624 |
| 2020/0225711 A1* | 7/2020 | Pelissier | G06F 1/1624 |
| 2020/0264660 A1* | 8/2020 | Song | H04M 1/0237 |
| 2020/0272271 A1* | 8/2020 | Seo | H05K 5/0217 |
| 2020/0315036 A1* | 10/2020 | Ahn | H05K 5/0017 |
| 2021/0044683 A1* | 2/2021 | He | G06F 1/1652 |
| 2021/0181801 A1* | 6/2021 | Yin | H04M 1/0268 |

FOREIGN PATENT DOCUMENTS

| | | |
|---|---|---|
| CN | 108519795 A | 9/2018 |
| CN | 208044998 U | 11/2018 |
| CN | 110491289 A | 11/2019 |
| CN | 110782783 A | 2/2020 |
| CN | 210324969 U | 4/2020 |
| KR | 20180031886 A | 3/2018 |
| WO | 2013033479 A2 | 3/2013 |

\* cited by examiner

FLEXIBLE DISPLAY DEVICE

FIELD OF INVENTION

The present disclosure relates to the field of display technology, and particularly relates to a flexible display device.

BACKGROUND OF INVENTION

Application of flexible display devices is becoming increasingly favored by the market. The flexible display devices have many advantages such as thinness and lightness, flexibility, foldability, and portability. Development of such technology will bring about significant revolution on forms of display, especially on wearable devices, mobile reading display, etc. With development of flexible display technology, flexible screens can be ingeniously swapped between different display dimensions and display regions to adapt to display requirements of different occasions. Meanwhile, storing and carrying the display screens after folding them is more convenient. Compared to traditional screens, advantages of the flexible screens are significant, which not only provide all-new usage effect to users, but also have more compact volumes and lower power consumption. Meanwhile, the screens have flexibility, reducing a risk of screen fracture.

With the development of the flexible displays, various display devices have appeared, for example, foldable display devices, slidable display devices, and rollable display devices, etc. The rollable display devices have a new flexible display manner, because they can omit coil spring assemblies of the display devices which are complicated and have short service life. Therefore, they have huge application value. However, how to ensure the flexible screens and structure thereof while realizing rolling, expanding, and contracting states at same time in current flexible display devices has become a hot spot problem of current researches. Men the flexible screens are in a process of rolling, expanding, and contracting, entire flexible display devices are prone to shaking, resulting in the screens to be prone to pulling or squeezing with other assemblies such as a supporting plate, thereby reducing the service life of the flexible screens.

SUMMARY OF INVENTION

A purpose of the present disclosure is to provide a flexible display device to solve the technical problem that the shake phenomenon easily occurs on the flexible display devices, and the flexible screens easily to pull or squeeze by other assemblies, thereby reducing the service life of the flexible screens.

In order to realize the purpose mentioned above, the present disclosure provides a flexible display device, including an outer frame, a first supporting plate, a second supporting plate, a roller device, rotating shaft assemblies, and a transmission assembly. The first supporting plate is mounted on the outer frame. The second supporting plate is extendably connected to the first supporting plate. The roller device is connected to the second supporting plate and is disposed on a lateral edge of the second supporting plate away from the first supporting plate. The rotating shaft assemblies are mounted on the outer frame. One end of the transmission assembly is connected to the rotating shaft assemblies, and another end of the transmission assembly is connected to the roller device. When the second supporting plate and the first supporting plate are expanded relatively or merged with each other, the transmission assembly guides the roller device and the rotating shaft assemblies to rotate simultaneously.

Furthermore, the transmission assembly includes a pair of racks disposed on a bottom surface of the second supporting plate in parallel, wherein the rotating shaft assemblies are rotatably connected to the racks; and a guy, wherein one end of the guy is wound on the rotating shaft assemblies, and another end of the guy is wound on the roller device.

Furthermore, the rotating shaft assemblies include a first rotating shaft and a second rotating shaft disposed in parallel under the first rotating shaft, wherein the first rotating shaft or the second rotating shaft is perpendicular to a length direction of the racks in an axial direction;

a pair of first gears, wherein middle sections of each of the first gears are fixed on two ends of the first rotating shaft, and teeth of the first gears are meshed on the racks;

a pair of second gears, wherein middle sections of each of the second gears are fixed on two ends of the second rotating shaft, and teeth of the second gears are meshed on corresponding teeth of the first gears; and a first flange, wherein a middle section of the first flange is fixed on the second rotating shaft, a first raceway is defined on a circumference of the first flange, and an end of the guy is wound in the first raceway.

Furthermore, the roller device includes a roller tube dismountably connected to the second supporting plate and disposed on the lateral edge of the second supporting plate away from the first supporting plate; a pair of end covers, wherein each of the end covers is dismountably connected to two ends of the roller tube; and a second flange, wherein a middle section of the second flange is fixed on the roller shaft, a second raceway is defined on a circumference of the first flange, and another end of the guy is wound in the second raceway.

Furthermore, radii of the second gear are less than radii of the first gears.

Furthermore, the first supporting plate includes a plurality of first supporting strips fixedly connected to the first supporting lateral plate, wherein two adjacent first supporting strips and the first supporting lateral plate define one first groove.

Furthermore, the second supporting plate includes a second supporting lateral plate; and a plurality of second supporting strips fixedly connected to the second supporting lateral plate, wherein two adjacent second supporting strips and the second supporting lateral plate define one second groove, wherein the first supporting strips and the second groove are meshed with each other, and the second supporting strips and the first groove are meshed with each other.

Furthermore, the outer frame is a square shape and includes a first frame body, a second frame body, a third frame body, and a fourth frame body which are connected head-to-tail, the first frame body is disposed opposite to the second frame body, the third frame body is disposed opposite to the fourth frame body, and chutes are defined on two surfaces of the first frame body and the second frame body disposed oppositely, and a connection plate fixed on the third frame body, wherein a top surface of the first frame body, a top surface of the second frame body, a top surface of the third frame body are on a same horizontal plane, a position of a top surface of the fourth frame body is lower than a position of the top surface of the first frame body, the first supporting lateral plate and the connection plate on the third frame body are fixed, an end of the first supporting strip away from the first supporting lateral plate is disposed on the top surface of the fourth frame body, and the second supporting plate is slidably disposed in the chutes and is disposed on the top surface of the fourth frame body.

Furthermore, the fourth frame body includes grooves, and the second supporting strips are slidably disposed in the grooves and configured to make the second supporting plate slide stably.

Furthermore, the flexible display device further includes a flexible display screen disposed on the first supporting plate and the second supporting plate in the chutes, a side of the flexible display screen is fixed on the third frame body, another side of the flexible display screen is wound on the roller device, the flexible display screen includes a display surface, the display surface and the top surface of the first frame body are on the same horizontal plane, or a position of the display surface is lower than the top surface of the first frame body.

A beneficial effect of the present disclosure is to provide the flexible display device to omit the coil spring structures in the prior art. Through the transmission manner of the gear and rack mechanisms coordinating with the guy, smooth transmission of the screens in a stretching process or a contracting process is ensured, while the gear and rack mechanisms can be ensured to operate synchronously in the stretching and contracting processes to prevent the flexible display screens from being pulled or undulated, improving the service life of the flexible display screens, and thereby improving user experience.

DESCRIPTION OF DRAWINGS

The technical solutions and other advantageous effects of the present invention will be apparent with reference to the following accompanying drawings and detailed description of embodiments of the present disclosure.

Figure 1:
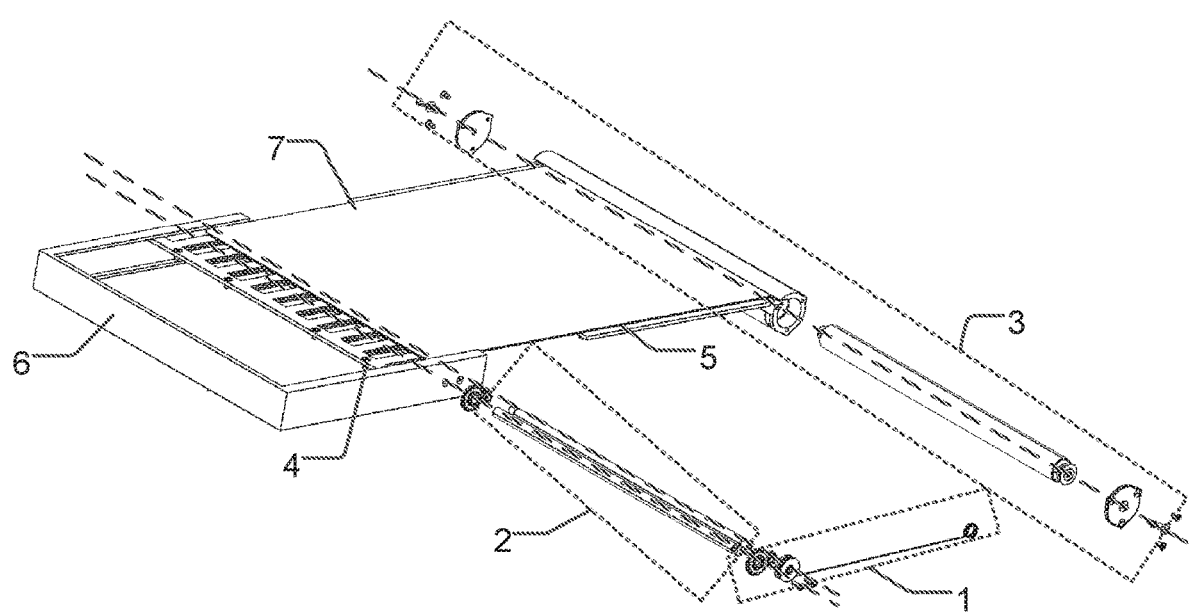
FIG. 1 is a structural schematic diagram of a flexible display device mentioned in one embodiment.

Components in the drawings are indicated as follows:
1, transmission component; 2, rotating shaft component; 3, roller device; 4, first supporting plate;
5, second supporting plate; 6, outer frame; 7, flexible display screen; 11, rack; 12, guy
21, first rotating shaft; 22, second rotating shaft; 23, first gear; 24, second gear;
25, first flange; 26, first raceway; 31 roller tube; 32 roller shaft; 33 end cover;
34, second flange; 35, second raceway; 36, screw hole; 37, screw;
41, first supporting lateral plate; 42, first supporting strip; 43, first groove;
51, second supporting lateral plate; 52, second supporting strip; 53, second groove;
61, first frame body; 62, second frame body; 63, third frame body; 64, fourth frame body; 65, bottom plate;
531, positioning groove; 532, engagement groove;
310 gap; 311, first screw hole; 312, first screw; 511, second screw hole;
330, end cover screw hole; 331, end cover screw;
610, chute; 611, connection plate; 612, third screw hole; 613, third screw; 614, fifth screw hole;
615, sixth screw hole; 616, fifth screw; 617, sixth screw; 410, fourth screw hole;
640, groove; 641, via hole.

DETAILED DESCRIPTION OF PREFERRED EMBODIMENTS

The technical solutions in the embodiments of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

In the description of the present disclosure, it is to be understood that the orientation or positional relationship indicated by the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise" etc. is based on the orientation or positional relationship shown in the accompanying figures, which is merely for the convenience for describing of the present disclosure and for the simplification of the description, and is not intended to indicate or imply that the indicated devices or elements have a specific orientation or is constructed and operated in a specific orientation. Therefore, it should not be understood as a limitation on the present disclosure. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, the meaning of "a plurality" is two or more unless clearly and specifically defined otherwise.

In the description of the present disclosure, unless specified or limited otherwise, terms "mounted," "connected," "coupled," and the like are used in a broad sense, and may include, for example, fixed connections, detachable connections, or integral connections; may also be mechanical or electrical connections or may be communication between each other; may also be direct connections or indirect connections via intervening structures; may also be inner communications of two elements or may be a relationship of interaction between two elements. For persons skilled in the art in this field, the specific meanings of the above terms in the present disclosure can be understood with specific cases.

The following disclosure provides many different embodiments or examples for implementing the different structures of the present disclosure. In order to simplify the disclosure of the present disclosure, the assemblies and configurations of the specific examples are described below. Of course, they are merely examples and are not intended to limit the present disclosure. In addition, the present disclosure may repeat reference numerals and/or reference numerals in different examples, which are for the purpose of simplicity and clarity, and do not indicate the relationship between the various embodiments and/or arrangements discussed. Moreover, the present disclosure provides embodiments of various specific processes and materials, but one of ordinary skill in the art will recognize the use of other processes and/or the use of other materials.

As illustrated in FIG. 1, one embodiment provides a flexible display device, including a transmission assembly 1, rotating shaft assemblies 2, a roller device 3, a first supporting plate 4, a second supporting plate 5, an outer frame 6, and a flexible display screen 7. Furthermore, the first supporting plate 4 is dismountably mounted on the outer frame 6, and the outer frame 6 is configured to fix the first supporting plate 4. The second supporting plate 5 is extendably connected to the first supporting plate 4. Of course, the second supporting plate 5 can also be slidably connected to the first supporting plate 4, and it is not limited thereto. The roller device 3 is dismountably connected to the second supporting plate 5 and is disposed on a lateral edge of the second supporting plate 5 away from the first supporting plate 4. One end of the transmission assembly 1 is connected to the rotating shaft assemblies 2, and another end is connected to the roller device 3. The rotating shaft assemblies 2 are dismountably mounted on the outer frame 6, are disposed under the first supporting plate 4, and are close to a side of the roller device 3. When the second supporting plate 5 and the first supporting plate 4 are expanded relatively or merged with each other, the transmission assembly 3 guides the roller device 2 and the rotating shaft assemblies 2 to rotate simultaneously.

Figure 2:
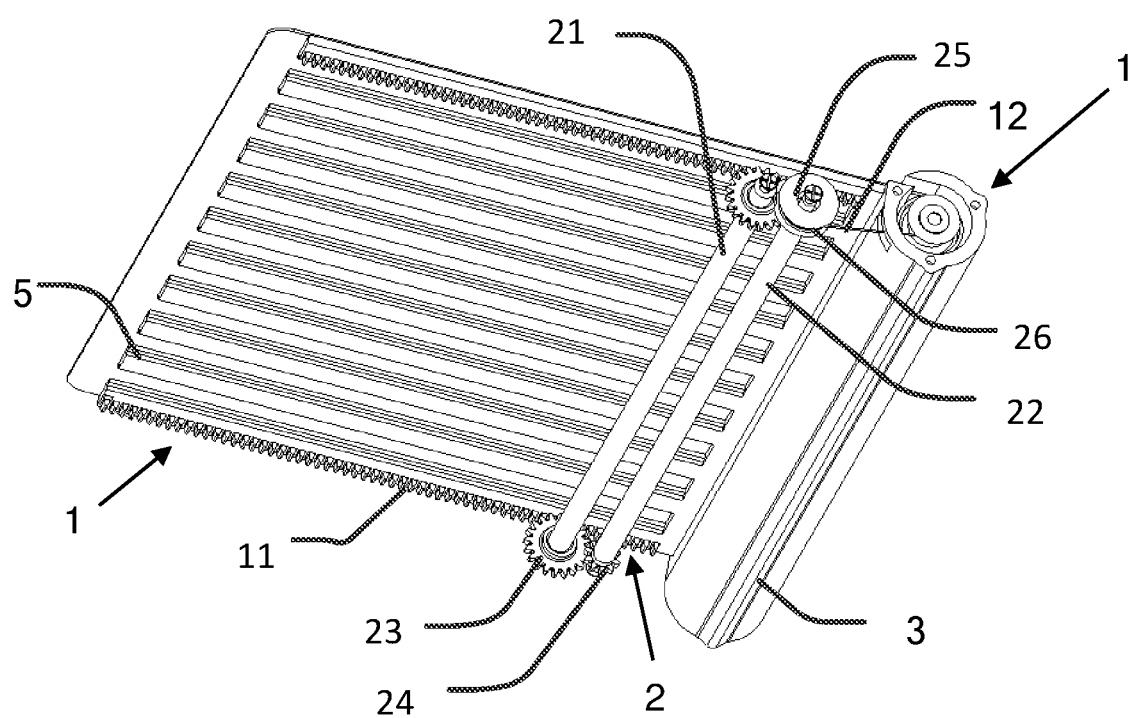
FIG. 2 is a structural schematic diagram of rotating shaft assemblies mentioned in one embodiment.

As illustrated in FIG. 2, when the transmission assembly 1 is rotating, gaps between the rotating shaft assemblies 2 and the roller device 3 can gradually increase or gradually reduce. When the gaps between the rotating shaft assemblies 2 and the roller device 3 gradually increase, that is, the flexible display screen 7 is in a relatively expanded state. When the gaps between the rotating shaft assemblies 2 and the roller device 3 gradually decrease, that is, the flexible display screen 7 is in a state merged with each other. The transmission assembly includes a pair of racks 11 and a guy 12.

The pair of racks 11 are disposed on a bottom surface of the second supporting plate 5 in parallel. The rotating shaft assemblies 2 are rotatably connected to the racks 11. One end of the guy 12 is wound on the rotating shaft assemblies 2, and another end is wound on the roller device 3.

As illustrated in FIG. 2, the rotating shaft assemblies 2 include a first rotating shaft 21, a second rotating shaft 22, a pair of first gears 23, a pair of second gears 24, a first flange 25, and a first raceway 26.

The first rotating shaft 21 and/or the second rotating shaft 22 are/is dismountably mounted on a frame body of the outer frame 6 and are/is disposed under the first supporting plate 4. The first rotating shaft 21 and/or the second rotating shaft 22 are/is perpendicular to a length direction of the racks 11 in an axial direction.

Middle sections of each of the first gears 23 are fixed on two ends of the first rotating shaft 21, and teeth of the first gears 23 are meshed on the racks 11.

Middle sections of each of the second gears 24 are fixed on two ends of the second rotating shaft 22, and teeth of the second gears 24 are meshed on corresponding teeth of the first gears. A middle section of the first flange 25 is fixed on the first rotating shaft 21 or the second rotating shaft 22. The first raceway 26 is defined on circumference of the first flange 25. An end of the guy 12 is wound in the first raceway 26. Furthermore, the middle section of the first flange 25 is fixed on the first rotating shaft 21. During operation, when the first rotating shaft 21 is rotating, the first rotating shaft 21 guides the first gears 23 and the first flange 25 fixed on the first rotating shaft 21 to rotate. In a rotating process, the first gears 23 are meshed to the racks 11 and guide the second supporting plate 5 to move. The guy 12 is tightened or loosened in the first raceway 26, thereby making the flexible display screen 7 to realize the tightening function or the loosening function.

Figure 3:
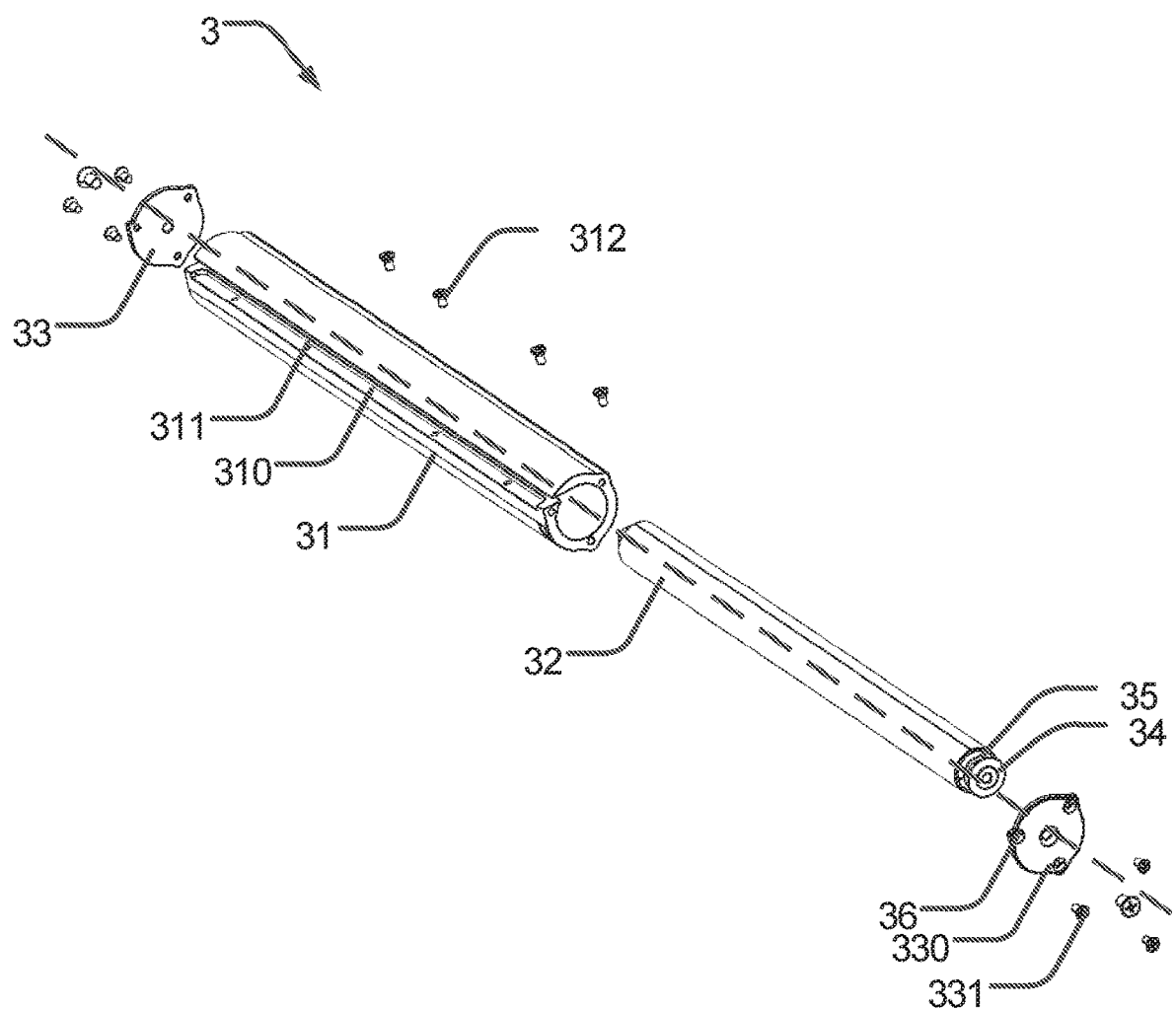
FIG. 3 is a structural schematic diagram of a roller device mentioned in one embodiment.

Preferably, the middle section of the first flange 25 is fixed on the second rotating shaft 22. During operation, when the first rotating shaft 21 and the second rotating shaft 22 are rotating, the first rotating shaft 21 guides the first gears 23 fixed on the first rotating shaft 21 to rotate, the second rotating shaft 22 guides the second gears 24 and the first flange 25 fixed on the second rotating shaft 22 to rotate. In a rotating process, the first gears 23 are meshed to the second gears 24 and the racks 11 and guide the second supporting plate 5 to move. The guy 12 is tightened or loosened in the first raceway 26, thereby making the flexible display screen 7 to realize the tightening function or the loosening function. Furthermore, in other embodiments, the first flange 25 and the first raceway 26 are disposed on two ends of the first rotating shaft 21 and/or the second rotating shaft 22, which can make the flexible display screen 7 be more smooth during rotation process and prevents the flexible display screens from being pulled or undulated to improve the service life of the flexible display screens. As illustrated in FIG. 3, the roller device 3 includes a roller tube 31, a roller shaft 32, a pair of end covers 33, a second flange 34, and a second raceway 35.

The roller tube 31 is dismountably connected to the second supporting plate 5 and is disposed on the lateral edge of the second supporting plate 5 away from the first supporting plate 4. The roller shaft 32 is disposed in the roller tube 31 and is disposed parallel to the first rotating shaft 21 relatively. Each of the end covers 33 is dismountably connected to two ends of the roller tube 31 to close the two ends of the roller tube 31. Each of the end covers 33 has a plurality of end cover screw holes 330 and a plurality of end cover screws 331 being threaded connection with the cover screw holes 330. The end covers 33 and the roller tube 31 are fixed by the threaded connection manner. A middle section of the second flange 34 is fixed on the roller shaft 32, a second raceway 35 is defined on circumference of the roller shaft 32, and a second end of the guy 12 is wound in the second raceway 35. In other embodiments, the second flange 34 and the second raceway 35 are disposed on two ends of the roller shaft 32, which can make the flexible display screen 7 be more smooth during the transmission process and prevents the flexible display screens from being pulled or undulated to improve the service life of the flexible display screens.

In this embodiment, the roller tube 31 has a gap 310 defined parallel to the roller shaft 32 relatively. The gap 310 has two surfaces, a top surface and a bottom surface. A plurality of first screw holes 311 are defined on the bottom surface and are in threaded connection with first screws 312. The second supporting plate 5 is disposed in the gap 310. Furthermore, second screw holes 511 defined relatively to the first screw holes 311 are defined on the second supporting plate 5. Please refer to FIG. 6, the first screws 312 sequentially penetrate the second screw holes 511 and the first screw holes 311, thereby making the second supporting plate 5 and the roller tube 31 in fixed connection.

Radii of the second gears 24 are less than radii of the first gears 23. When the second supporting plate 5 and the first supporting plate 4 are expanded relatively or merged with each other, the racks 11 mesh with the first gears 23 and guides the second gears 24 to rotate. The second gears 24 guide the first flange 25 in the same shaft, and the first flange 25 guides the second flange 24 to tighten or release the guys 12. When the second supporting plate 5 and the first supporting plate 4 are merged with each other, the guy 12 and the first flange 25 rotate together, and the guy 12 in the second raceway 35 is released to be wound in the first raceway 26 loop by loop. When the second supporting plate 5 and the first supporting plate 4 are expanded relatively, the guy 12 and the second flange 34 rotate together, and the guy 12 in the first raceway 26 is released to be wound in the second raceway 35 loop by loop.

Figure 4:
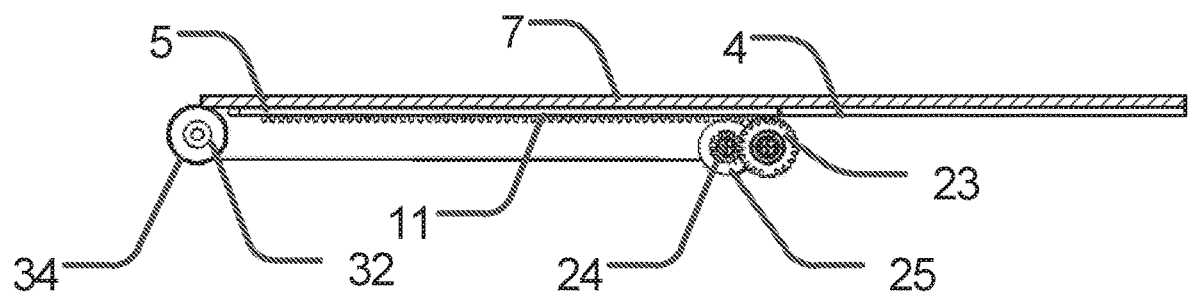
FIG. 4 is a first lateral view of the rotating shaft assemblies mentioned in one embodiment.
Figure 5:
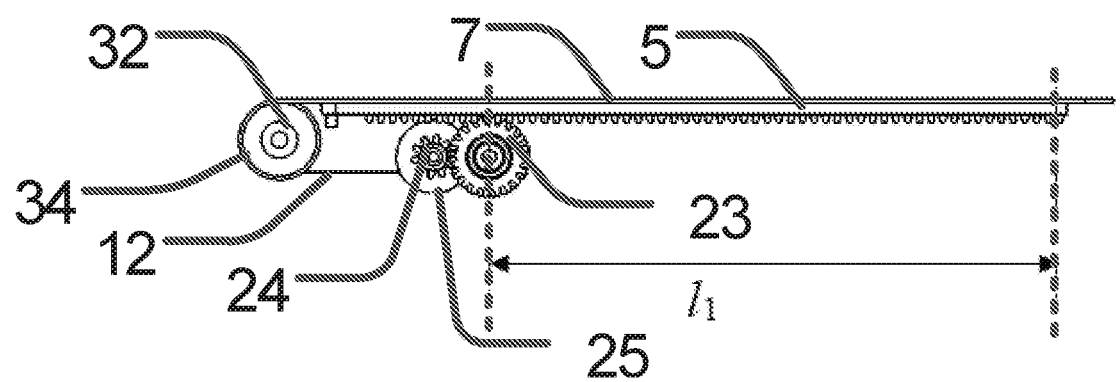
FIG. 5 is a second lateral view of the rotating shaft assemblies mentioned in one embodiment.

As illustrated in FIGS. 4 to 5, the radii of the first gears 23 are r1, the radii of the second gears 24 are r2, a radius of the first flange 25 is r3, a radius of the second flange 34 is r4, a radius of the roller shaft 32 is r5, a stroke of the flexible display device from the relatively merged state to the relatively expanded state is l1. In this embodiment, when l1 is known, according to positional relationships between the first gears 23, second gears 24, the first flange 25, and the second flange 34, it can be understood that:

a number of rotation of the first gears 23 is $k1=l1/(r1*\pi)$;

a number of rotation of the second gears 24 is $k2=k1(r1/r2)=l1/(r1*\pi)(r1/r2)=l1/(\pi*r2)$;

a length of the guy wound by the first flange 25 is $l2=k2*r3*\pi=l1/(\pi*r2)*r3*\pi=l1*r3/r2$;

a number of rotation of the second flange 34 is $l3=l1/(r5*\pi)$; and a length of the guy released by the second flange 34 is $l4=l3*\pi*r4=l1*r4/r5$.

In this embodiment, during the stretching or winding processes of the flexible display screen 7, which is the processes of the second supporting plate 5 and the first supporting plate 4 relatively expanded or merged with each other, a stretching speed or a winding speed of the flexible display screen 7 is same as a releasing speed from the second flange 34 to the guy 12, making the flexible display screen 7 not receive force, and preventing undulating phenomenon from generating on the flexible display screen 7. Furthermore, releasing the guy 12 from the second flange 34 is due to winding of the first flange 25, and a difference value is a stroke l4, that is $l2=l1+l4$, therefore, $r3/r2+r4/r5=1$. Therefore, when dimensions of each parts and assemblies of the first gears 23, the second gears 24, the first flange 25, the second flange 34, and the roller shaft 32 satisfy the above relationships, each parts and assemblies of the flexible display device cannot be pulled or squeezed to the flexible display screen during the process of the second supporting plate 5 and the first supporting plate 4 expanded relatively or merged with each other.

Figure 6:
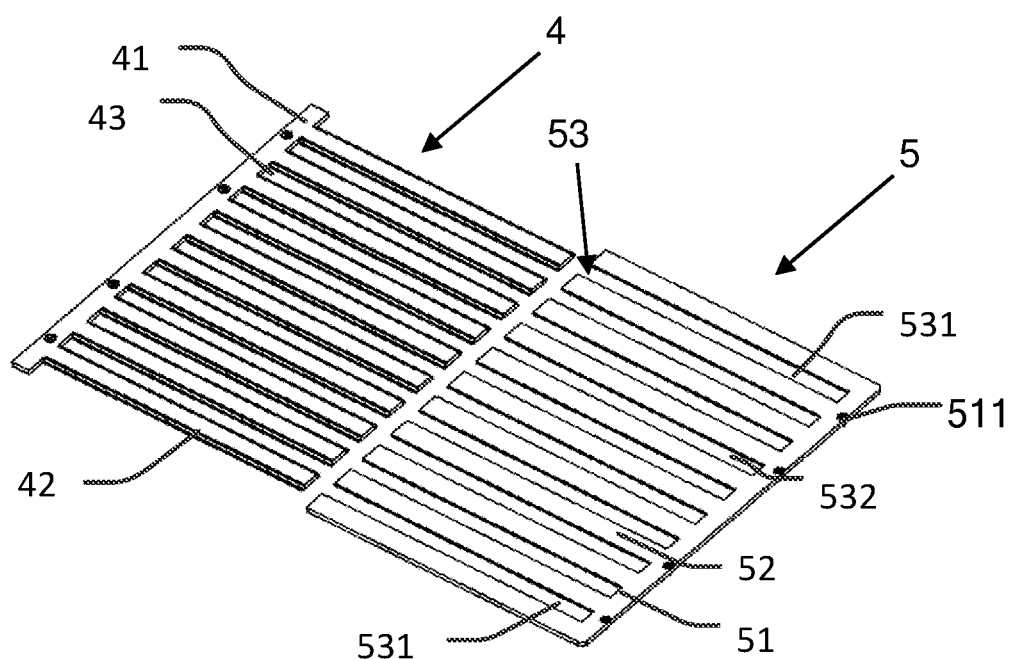
FIG. 6 is a structural schematic diagram of a first supporting plate and a second supporting plate mentioned in one embodiment.

As illustrated in FIG. 6, the first supporting plate 4 is a gate-shaped structure, including a first supporting lateral plate 41, first supporting strips 42, and first grooves 43.

The plurality of first supporting strips 42 are fixedly connected to the first supporting lateral plate 41. Two adjacent first supporting strips 42 and the first supporting lateral plate 41 define one first groove 43.

The second supporting plate 5 is a gate-shaped structure, including a second supporting lateral plate 51, second supporting strips 52, and second grooves 53.

The plurality of second supporting strips 52 are fixedly connected to the second supporting lateral plate 51. Two adjacent second supporting strips 52 and the second supporting lateral plate 51 define one second groove 53. The second grooves 53 close to the two ends of the second supporting plate 51 are positioning grooves 531. Other second grooves 53 are engagement grooves 532. Gaps of the engagement grooves 532 are greater than gaps of the positioning grooves 531. Specifically, the gaps of the positioning grooves 531 are less than 0.1 µm, and are preferably 0.08 µm, 0.07 µm, 0.06 µm, 0.05 µm, and 0.04 µm. The gaps of the engagement grooves 532 are greater than or equal to 0.2 µm. The gaps of the engagement grooves 532 range from 0.21 µm to 0.5 µm, and a specific value is preferred to be 0.22 µm, 0.25 µm, 0.26 µm, 0.28 µm, and 0.3 µm. When the second supporting plate 5 and the first supporting plate 4 are expanded relatively and merged with each other, the second supporting plate 5 and the first supporting plate 4 will not shake due to excessive friction, thereby not resulting in poor pushing and pulling effects and affecting user experience.

Figure 7:
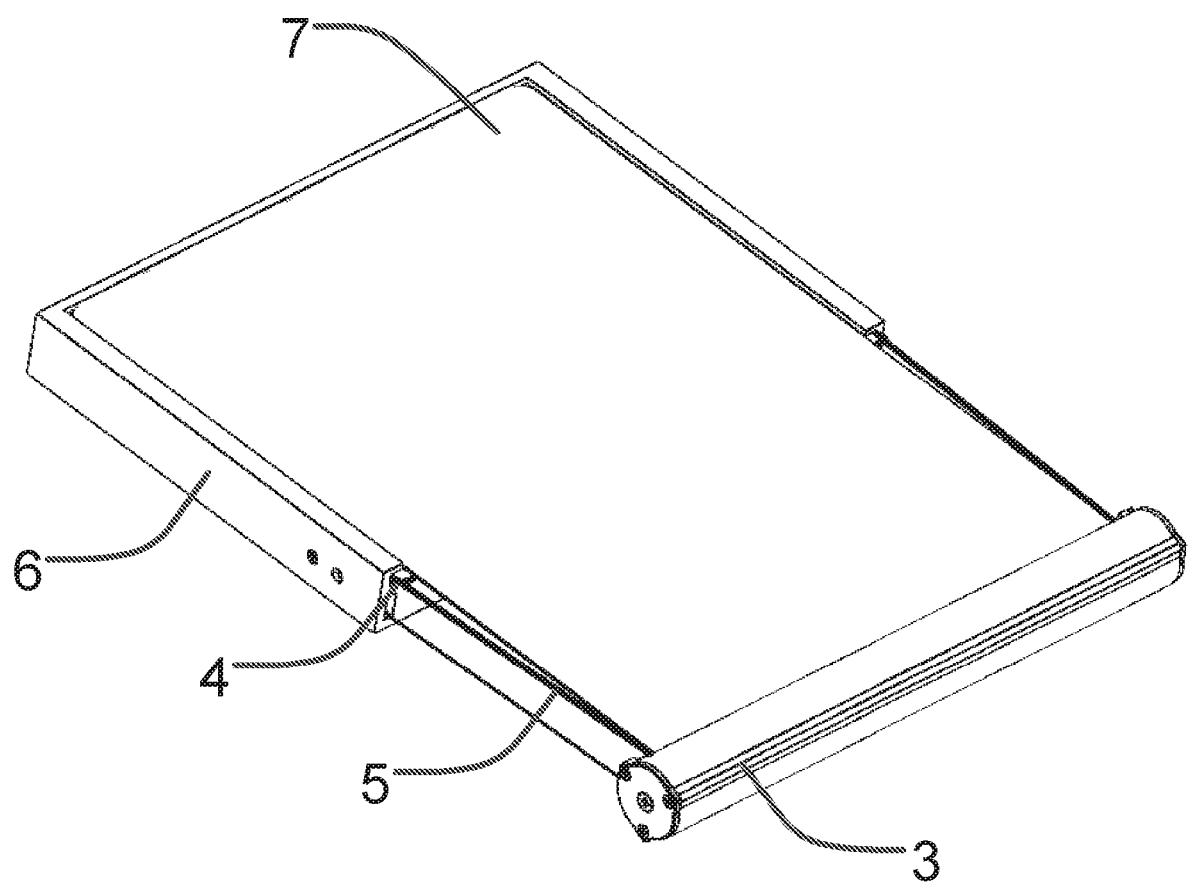
FIG. 7 is a structural schematic diagram of the first supporting plate and the second supporting plate expanded relatively mentioned in one embodiment.

As illustrated in FIG. 7, the first supporting strips 42 and the second groove 53 are meshed with each other. The second supporting strips 52 and the first groove 43 are meshed with each other. When the second supporting plate 5 and the first supporting plate 4 are expanded relatively, the second supporting plate 5 and the first supporting plate 4 provide support to make the flexible display screen 7 be maximized, so the flexible display screen 7 has a maximum display screen. In a situation where the flexible display screen 7 receives an external force, a dent phenomenon cannot occur, preventing the flexible display screen 7 from deformation.

Figure 8:
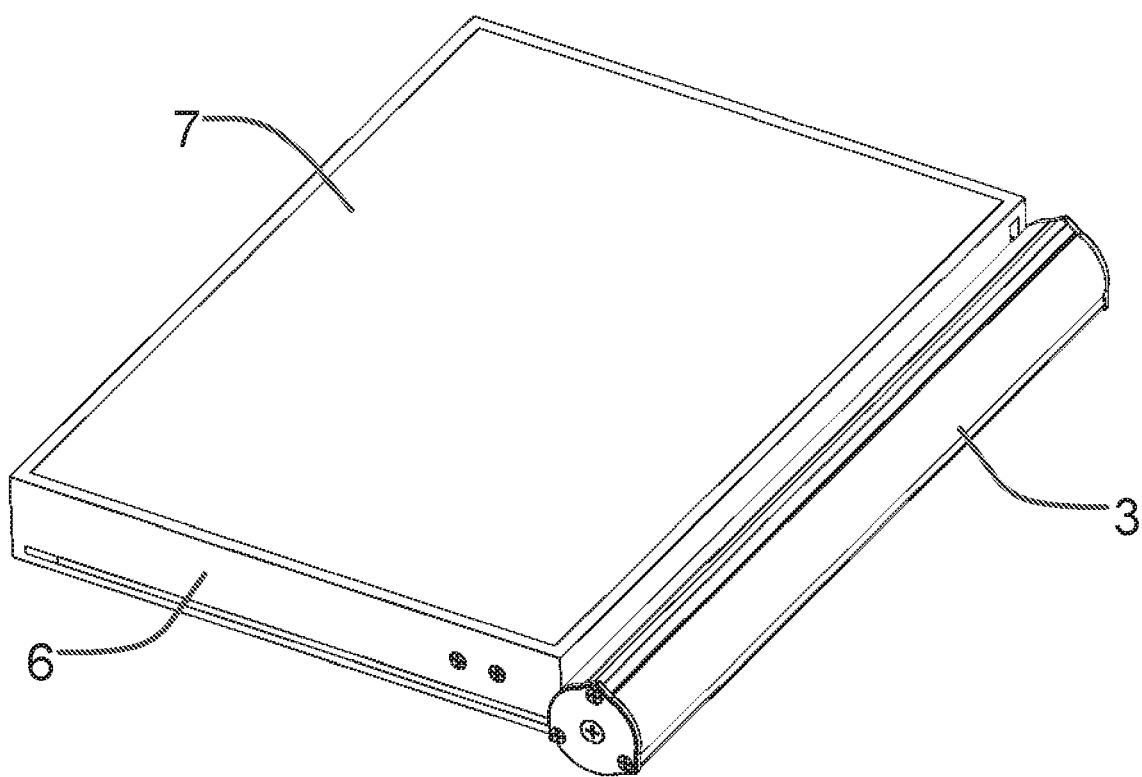
FIG. 8 is a structural schematic diagram of the first supporting plate and the second supporting plate merged relatively mentioned in one embodiment.

As illustrated in FIG. 8, when the second supporting plate 5 and the first supporting plate 4 are merged with each other, the second supporting plate 5 is contracted into the outer frame 6 and is disposed in a staggered manner with the first supporting plate 4 to form a smaller flexible display device, which facilitates carrying by users and improves user experience.

Figure 9:
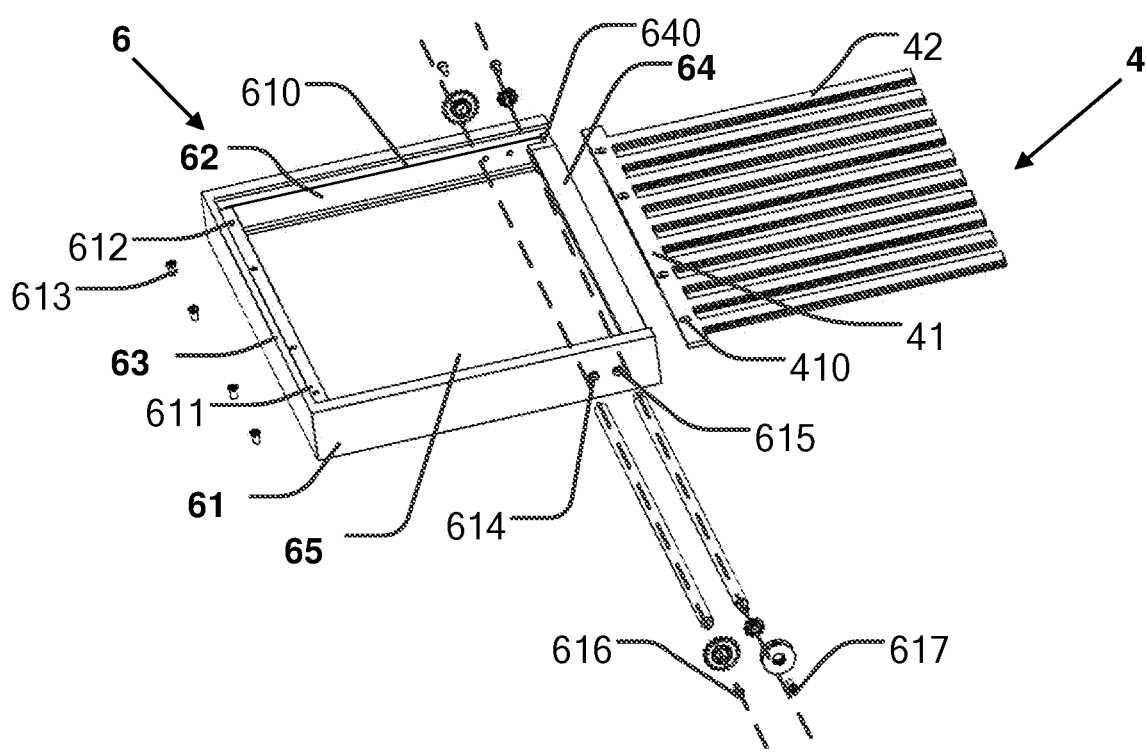
FIG. 9 is a structural schematic diagram of an outer frame mentioned in one embodiment.
Figure 10:
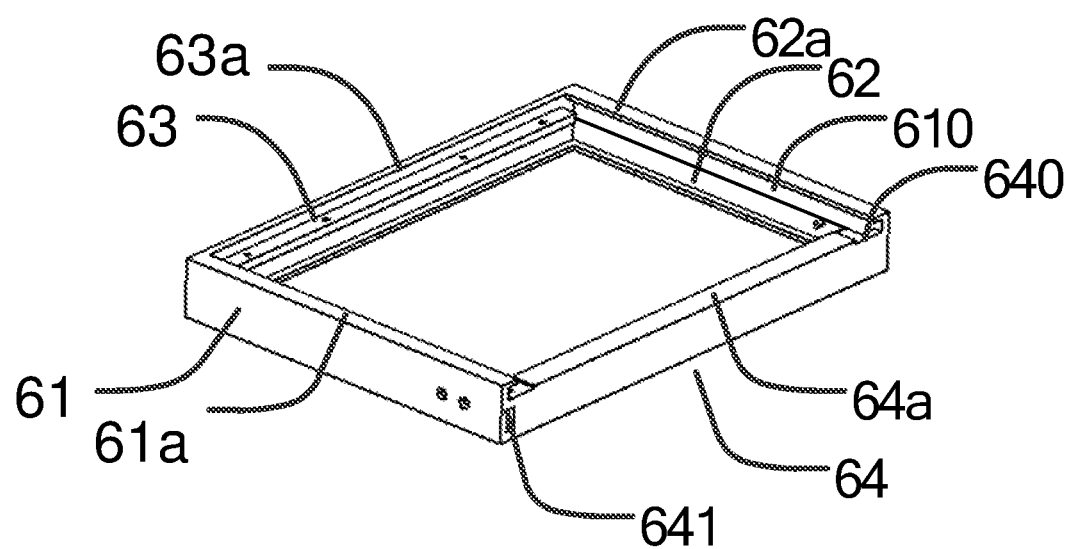
FIG. 10 is another structural schematic diagram of the outer frame mentioned in one embodiment.

As illustrated in FIGS. 9 to 10, the outer frame 6 is a square shape configured to fix the first supporting plate 4 and the second supporting plate 3. The outer frame includes a first frame body 61, a second frame body 62, a third frame body 63, and a fourth frame body 64 which are connected head-to-tail, and a bottom plate 65. The bottom plate 65, the first frame body 61, the second frame body 62, the third frame body 63, and the fourth frame body 64 are arranged around to form a hollow cavity.

The first frame body 61 is disposed opposite to the second frame body 62. An end of the first frame body 61 and an end of the second frame body 62 are respectively connected to ends of the third frame body 63 perpendicularly. The third frame body 63 is disposed opposite to the fourth frame body 64. A connection plate 611 is fixed on the third frame body 63 and protrudes on an inner lateral wall of the third frame body 63. Furthermore, a top surface 61a of the first frame body, a top surface 62a of the second frame body, a top surface 63a of the third frame body are on a same horizontal plane, and a position of a top surface 64a of the fourth frame body is lower than a position of the top surface 61a of the first frame body. Furthermore, the position of the top surface 64a of the fourth frame body and a top surface of the connection plate 611 are on a same horizontal plane. When the first supporting plate 4 and the second supporting plate 5 are located on the upper surface 64a of the fourth frame and the upper surface of the connecting plate 611, a phenomenon of high and low heights cannot occur, and the flatness of the flexible display device is improved.

The first supporting plate 41 and the connection plate 611 on the third frame body 63 are fixed, and an end of the first supporting strip 42 away from the first supporting lateral plate 41 is disposed on the top surface of the fourth frame body 64. Specifically, a plurality of third screw holes 612 penetrate the connection plate 611, and the third screw holes 612 and a plurality of third screws 613 are in threaded connection. Fourth screw holes 410 are defined on the first supporting lateral plate 41 and are relatively disposed with the third screw holes 612. Dimensions of the fourth screw holes 410 are same as dimensions of the third screw holes 612. When the third screws 613 sequentially penetrate the third screw holes 612 and the fourth screw holes 410, the first supporting plate 4 and the outer frame 6 are connected by screw threads.

Chutes 610 are defined on two surfaces of the first frame body 61 and the second frame body 62 disposed oppositely, and the second supporting strips on the two sides of the second supporting plate 5 are slidably disposed in the chutes 610 and are disposed on the top surface 64a of the fourth frame body. In this embodiment, the fourth frame body 64 has one groove 640, the groove 640 concaves on the top surface 64a of the fourth frame body, and the second supporting strips 52 are slidably disposed in the grooves 640. Preferably, the groove 640 is defined on two ends of the fourth frame body 64, the second supporting strips 51 on the two sides of the second supporting plate are slidably disposed in the chutes 640. Therefore, when the second supporting plate 5 is in the sliding process, the second supporting plate 5 cannot shake and is smooth, preventing poor effects of pulling and squeezing generating on the flexible display screen. In this embodiment, bottom surfaces of the first supporting strips 42 and bottom surfaces of the second supporting strips 52 are tangent to the top surface 64a of the fourth frame body. Furthermore, because the two outermost second supporting strips 52 of the second supporting plate 5 are slidably disposed in the groove 640, and thicknesses of the two outermost second supporting strips 52 of the second supporting plate 5 are greater than thicknesses of the other second supporting strips 52, making the two outermost second supporting strips 52 of the second supporting plate 5 and the other second supporting strips 52 remain on a same horizontal plane. Therefore, when the first supporting plate 4 and the second supporting plate 5 are expanded relatively or merged with each other, that is, when the flexible display screen is in the process of realizing stretching or winding, the second supporting plate 5 and the first supporting plate 4 will not shake due to excessive friction, making the first supporting plate push and pull smoothly, and each parts and assemblies of the flexible display device cannot be pulled and squeezed to the flexible display screen, improving user experience. Please refer to FIG. 10, a via hole 641 is defined on the fourth frame body 64, and the guy 12 penetrates the via hole 641 and is connected to the roller device 3. In this embodiment, fifth screw holes 614 and sixth screw holes 615 are defined on the first frame body 61 and the second frame body 62. Furthermore, two ends of the first rotating shaft 21 have first rotating shaft screw holes. Dimensions of the first rotating shaft screw holes are same as dimensions of the fifth screw holes 614. The fifth screws 616 sequentially penetrate the fifth screw holes 614 and the first rotating shaft screw holes, making the first rotating shaft screw holes 21 be fixed between the first frame body 61 and the second frame body 62. Two ends of the second rotating shaft 22 have second rotating shaft screw holes. Dimensions of the second rotating shaft screw holes are same as dimensions of the sixth screw holes 615. The sixth screws 617 sequentially penetrate the sixth screw holes 615 and the second rotating shaft screw holes, making the second rotating shaft 22 be fixed between the first frame body 61 and the second frame body 62.

Please refer to FIG. 7, the flexible display screen 7 is disposed on the first supporting plate 4 and the second supporting plate 5 in the chutes, a side of the flexible display screen 7 is fixed on the third frame body, and another side of the flexible display screen 7 is wound on the roller device 3.

Figure 11:
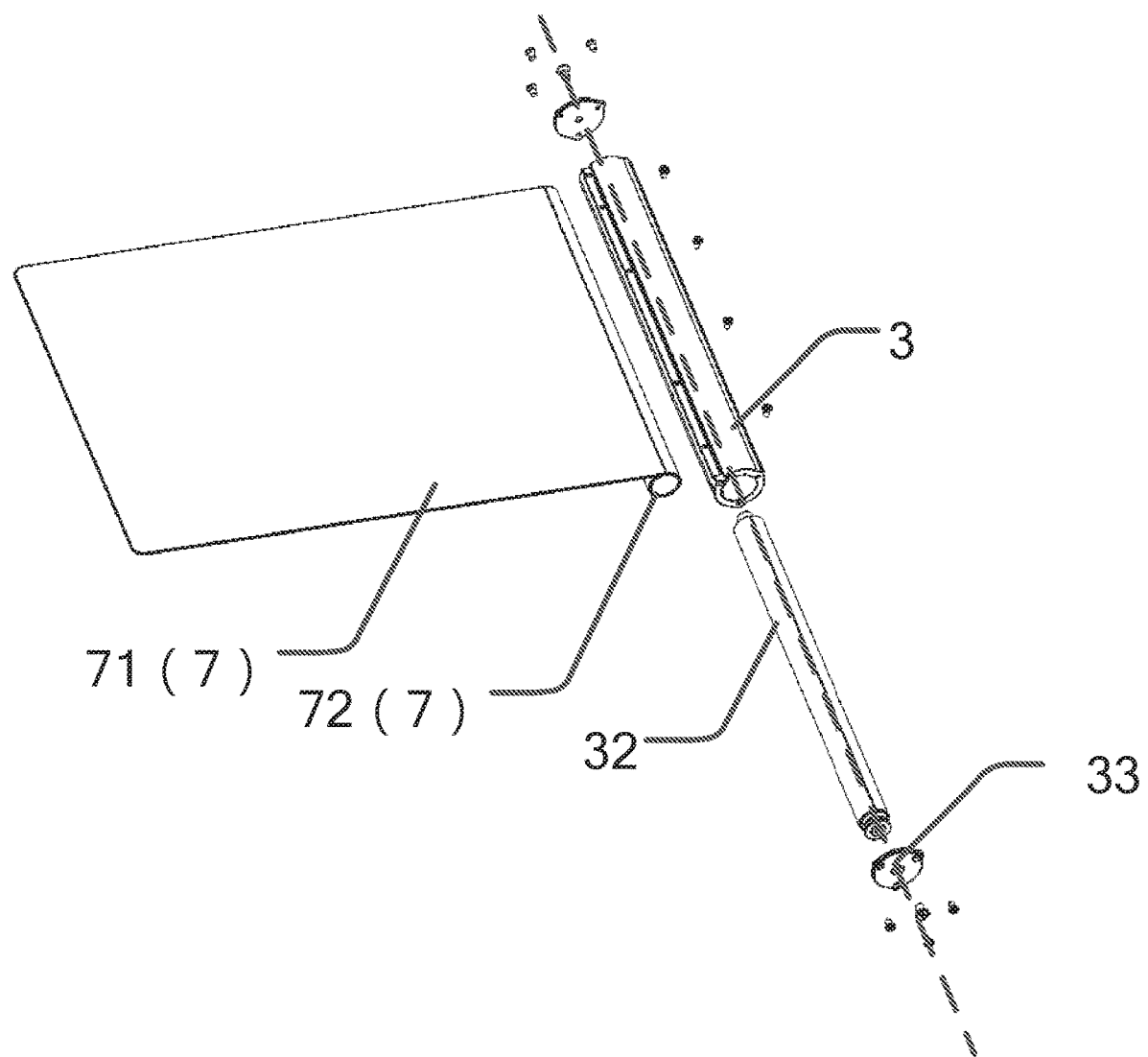
FIG. 11 is a structural schematic diagram of a flexible display screen mentioned in one embodiment.

As illustrated in FIG. 11, the flexible display screen 7 has a display surface 71 and a sleeve 72. The display surface 71 and the top surface of the first frame body is on the same horizontal plane, or a position of the display surface 71 is lower than the top surface of the first frame body. The display surface 71 is in fixed connection with the sleeve 72. An inner lateral wall of the sleeve 72 is tangent to an outer lateral wall of the roller shaft 32. When the second supporting plate 5 and the first supporting plate 4 are merged with each other, the sleeve 72 and the roller shaft 32 rotate simultaneously, the display surface 71 is wound and is stored in the roller tube 31. When the second supporting plate 5 and the first supporting plate 4 are expanded relatively, the sleeve 72 and the roller shaft 32 rotate simultaneously, the display surface 71 is stretched, and the display surface 71 stored in the roller shaft 32 is stretched outside. The small display surface 71 gradually becomes the big display surface 71, making the display device have a larger screen.

Compared to the prior art, the embodiments omit the coil spring structures in the prior art. Through the transmission manner of the gear and rack mechanisms coordinating with the guy, smooth transmission of the screens in a stretching process or a contracting process is ensured, while the gear and rack mechanisms can be ensured to operate synchronously in the stretching process and contracting processes to prevent the flexible display screens from being pulled or undulated, improving the service life of the flexible display screens, and thereby improving user experience.

The flexible display device provided by embodiments of present disclosure are described in detail above. This article uses specific cases for describing the principles and the embodiments of the present disclosure, and the description of the embodiments mentioned above is only for helping to understand the method and the core idea of the present disclosure. It should be understood by those skilled in the art, that it can perform changes in the technical solution of the embodiments mentioned above, or can perform equivalent replacements in part of technical characteristics, and the changes or replacements do not make the essence of the corresponding technical solution depart from the scope of the technical solution of each embodiment of the present disclosure.

What is claimed is:

1. A flexible display device, comprising:
    an outer frame;
    a first supporting plate mounted on the outer frame;
    a second supporting plate extendably connected to the first supporting plate;
    a roller device connected to the second supporting plate and disposed on a lateral edge of the second supporting plate away from the first supporting plate;
rotating shaft assemblies mounted on the outer frame; and
a transmission assembly connected to the rotating shaft assemblies and the roller device,
wherein when the second supporting plate and the first supporting plate are expanded relatively or merged with each other, the transmission assembly guides the roller device and the rotating shaft assemblies to rotate simultaneously,
wherein the transmission assembly comprises:
a pair of racks disposed on a bottom surface of the second supporting plate in parallel, wherein the rotating shaft assemblies are rotatably connected to the racks; and
a guy, wherein one end of the guy is wound on the rotating shaft assemblies, and another end of the guy is wound on the roller device,
wherein the rotating shaft assemblies comprise:
a first rotating shaft and a second rotating shaft disposed in parallel under the first rotating shaft, wherein the first rotating shaft or the second rotating shaft is perpendicular to a length direction of the racks in an axial direction;
a pair of first gears, wherein middle sections of each of the first gears are fixed on two ends of the first rotating shaft, and teeth of the first gears are meshed on the racks;
a pair of second gears, wherein middle sections of each of the second gears are fixed on two ends of the second rotating shaft, and teeth of the second gears are meshed on corresponding teeth of the first gears; and
a first flange, wherein a middle section of the first flange is fixed on the second rotating shaft, a first raceway is defined on a circumference of the first flange, and an end of the guy is wound in the first raceway.

2. The flexible display device as claimed in claim 1, wherein the roller device comprises:
a roller tube dismountably connected to the second supporting plate and disposed on the lateral edge of the second supporting plate away from the first supporting plate;
a roller shaft disposed in the roller tube and disposed parallel to the first rotating shaft relatively;
a pair of end covers, wherein each of the end covers is dismountably connected to two ends of the roller tube; and
a second flange, wherein a middle section of the second flange is fixed on the roller shaft, a second raceway is defined on a circumference of the roller shaft, and another end of the guy is wound in the second raceway.

3. The flexible display device as claimed in claim 1, wherein radii of the second gears are less than radii of the first gears.

4. The flexible display device as claimed in claim 1, wherein
the first supporting plate comprises:
a first supporting lateral plate; and
a plurality of first supporting strips fixedly connected to the first supporting lateral plate, wherein
two adjacent first supporting strips and the first supporting lateral plate define one first groove.

5. The flexible display device as claimed in claim 4, wherein
the second supporting plate comprises:
a second supporting lateral plate; and
a plurality of second supporting strips fixedly connected to the second supporting lateral plate, wherein
two adjacent second supporting strips and the second supporting lateral plate define one second groove,
wherein the first supporting strips and the second groove are meshed with each other,
and the second supporting strips and the first groove are meshed with each other.

6. The flexible display device as claimed in claim 4, wherein
second grooves located on two ends of the second supporting plate are positioning grooves, other second grooves are engagement grooves, and gaps of the engagement grooves are greater than gaps of the positioning grooves.

7. The flexible display device as claimed in claim 5, wherein
the outer frame is a square shape and comprises a first frame body, a second frame body, a third frame body, and a fourth frame body which are connected head-to-tail, the first frame body is disposed opposite to the second frame body, the third frame body is disposed opposite to the fourth frame body, and chutes are defined on two surfaces of the first frame body and the second frame body disposed oppositely, and
a connection plate fixed on the third frame body,
wherein a top surface of the first frame body, a top surface of the second frame body, and a top surface of the third frame body are on a same horizontal plane, and a position of a top surface of the fourth frame body is lower than a position of the top surface of the first frame body; and
the first supporting lateral plate and the connection plate on the third frame body are fixed, an end of the first supporting strips away from the first supporting lateral plate is disposed on the top surface of the fourth frame body, and the second supporting plate is slidably disposed in the chutes and is disposed on the top surface of the fourth frame body.

8. The flexible display device as claimed in claim 7, wherein
the fourth frame body comprises grooves, and the second supporting strips are slidably disposed in the grooves and configured to make the second supporting plate slide stably.

9. The flexible display device as claimed in claim 7, wherein the flexible display device comprises:
a flexible display screen disposed on the first supporting plate and the second supporting plate in the chutes, a side of the flexible display screen is fixed on the third frame body, another side of the flexible display screen is wound on the roller device, the flexible display screen comprises a display surface, the display surface and the top surface of the first frame body are on the same horizontal plane, or a position of the display surface is lower than the top surface of the first frame body.

* * * * *